United States Patent
Chang et al.

(10) Patent No.: US 7,803,257 B2
(45) Date of Patent: Sep. 28, 2010

(54) CURRENT-LEVELING ELECTROPLATING/ELECTROPOLISHING ELECTRODE

(75) Inventors: Shih-Chieh Chang, Tainan (TW); Ying-Lang Wang, Taiching County (TW); Kei-Wei Chen, Taipei (TW); Shih-Ho Lin, Tainan (TW); Chun-Chang Chen, Tainan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 965 days.

(21) Appl. No.: 10/971,836

(22) Filed: Oct. 22, 2004

(65) Prior Publication Data

US 2006/0086609 A1    Apr. 27, 2006

(51) Int. Cl.
*C25D 17/14* (2006.01)
*C25D 17/12* (2006.01)

(52) U.S. Cl. ............... 204/224 R; 204/224 M; 204/280; 204/286.1; 204/287

(58) Field of Classification Search .......... 205/252; 204/224 R, 224 M, 280, 286.1, 287
See application file for complete search history.

(56) References Cited

U.S. PATENT DOCUMENTS

| | | | | |
|---|---|---|---|---|
| 5,217,586 A | * | 6/1993 | Datta et al. | 205/666 |
| 6,475,287 B1 | * | 11/2002 | Clark | 118/721 |
| 6,773,576 B2 | * | 8/2004 | Volodarsky et al. | 205/670 |
| 2002/0079230 A1 | * | 6/2002 | Basol et al. | 205/157 |
| 2003/0079983 A1 | * | 5/2003 | Long et al. | 204/164 |

FOREIGN PATENT DOCUMENTS

| | | |
|---|---|---|
| TW | 565895 | 3/2003 |
| TW | 524895 | 12/2003 |

OTHER PUBLICATIONS

Merriam-Webster Dictionary, 1997, Tenth Edition, p. 334.*

* cited by examiner

*Primary Examiner*—Bruce F Bell
(74) *Attorney, Agent, or Firm*—Tung & Associates

(57) ABSTRACT

A current-leveling electrode for improving electroplating and electrochemical polishing uniformity in the electrochemical plating or electropolishing of metals on a substrate is disclosed. The current-leveling electrode includes a base electrode and at least one sub-electrode carried by the base electrode. The at least one sub-electrode has a width which is less than a width of the base electrode to impart a generally tapered, stepped or convex configuration to the current-leveling electrode.

28 Claims, 3 Drawing Sheets

CURRENT-LEVELING ELECTROPLATING/ELECTROPOLISHING ELECTRODE

FIELD OF THE INVENTION

The present invention relates to electrochemical plating (ECP)/electropolishing processes used to deposit/polish metal layers on semiconductor wafer substrates in the fabrication of semiconductor integrated circuits. More particularly, the present invention relates to a current-leveling electrode which includes a base electrode and one or multiple sub-electrodes which can be selectively added to the base electrode to improve uniformity in the electroplating or electropolishing of metals on a substrate.

BACKGROUND OF THE INVENTION

In the fabrication of semiconductor integrated circuits, metal conductor lines are used to interconnect the multiple components in device circuits on a semiconductor wafer. A general process used in the deposition of metal conductor line patterns on semiconductor wafers includes deposition of a conducting layer on the silicon wafer substrate; formation of a photoresist or other mask such as titanium oxide or silicon oxide, in the form of the desired metal conductor line pattern, using standard lithographic techniques; subjecting the wafer substrate to a dry etching process to remove the conducting layer from the areas not covered by the mask, thereby leaving the metal layer in the form of the masked conductor line pattern; and removing the mask layer typically using reactive plasma and chlorine gas, thereby exposing the top surface of the metal conductor lines. Typically, multiple alternating layers of electrically conductive and insulative materials are sequentially deposited on the wafer substrate, and conductive layers at different levels on the wafer may be electrically connected to each other by etching vias, or openings, in the insulative layers and filling the vias using aluminum, tungsten or other metal to establish electrical connection between the conductive layers.

Electrochemical deposition or electrochemical plating of metals on wafer substrates has recently been identified as a promising technique for depositing conductive layers on the substrates in the manufacture of integrated circuits and flat panel displays. Such electrodeposition processes have been used to achieve deposition of the copper or other metal layer with a smooth, level or uniform top surface. Consequently, much effort is currently focused on the design of electroplating hardware and chemistry to achieve high-quality films or layers which are uniform across the entire surface of the substrates and which are capable of filling or conforming to very small device features. Copper has been found to be particularly advantageous as an electroplating metal.

Copper provides several advantages over aluminum when used in integrated circuit (IC) applications. Copper is less electrically resistive than aluminum and is thus capable of higher frequencies of operation. Furthermore, copper is more resistant to electromigration (EM) than is aluminum. This provides an overall enhancement in the reliability of semiconductor devices because circuits which have higher current densities and/or lower resistance to EM have a tendency to develop voids or open circuits in their metallic interconnects. These voids or open circuits may cause device failure or burn-in.

A typical standard or conventional electroplating system for depositing a metal such as copper onto a semiconductor wafer includes a standard electroplating cell having an adjustable current source, a bath container which holds an electrolyte solution (typically acid copper sulfate solution), and a copper anode and a cathode immersed in the electrolyte solution. The cathode is the semiconductor wafer that is to be electroplated with metal. Both the anode and the semiconductor wafer/cathode are connected to the current source by means of suitable wiring. The electrolyte solution may include additives for filling of submicron features and leveling the surface of the copper electroplated on the wafer. An electrolyte holding tank may further be connected to the bath container for the addition of extra electrolyte solution to the bath container.

In operation of the electroplating system, the current source applies a selected voltage potential typically at room temperature between the anode and the cathode/wafer. This potential creates a magnetic field around the anode and the cathode/wafer, which magnetic field affects the distribution of the copper ions in the bath. In a typical copper electroplating application, a voltage potential of about 2 volts may be applied for about 2 minutes, and a current of about 4.5 amps flows between the anode and the cathode/wafer. Consequently, copper is oxidized at the anode as electrons from the copper anode and reduce the ionic copper in the copper sulfate solution bath to form a copper electroplate at the interface between the cathode/wafer and the copper sulfate bath.

The copper oxidation reaction which takes place at the anode is illustrated by the following reaction equation:

$$Cu \rightarrow Cu^{++} + 2e^-$$

The oxidized copper cation reaction product forms ionic copper sulfate in solution with the sulfate anion in the bath 20:

$$Cu^{++} + SO_4^{--} \rightarrow Cu^{++}SO_4^{--}$$

At the cathode/wafer, the electrons harvested from the anode flowed through the wiring reduce copper cations in solution in the copper sulfate bath to electroplate the reduced copper onto the cathode/wafer:

$$Cu^{++} + 2e^- \rightarrow Cu$$

In an electropolishing process, an electroplated metal is removed from a substrate. Therefore, the wafer becomes the anode and the electroplated metal on the wafer is oxidized to form metal cations. The metal cations enter the electrolyte solution and are reduced and electroplated onto the cathode.

A typical conventional electrochemical plating apparatus 10 is shown in FIG. 1. The apparatus 10 includes a tank 12 which contains an electroplating electrolyte solution (not shown). An anode 14 and a cathode 16, which is the wafer to be electroplated with metal from the anode 14, are immersed in the solution. The anode 14 typically has a planar surface 14a.

During an electroplating process, metal from the anode 14 is electroplated onto the cathode/wafer 16 as electroplated metal 18. However, the planar surface 14a of the anode 14 causes non-uniform current distribution in the tank 12, with current field lines concentrated at the edge regions relative to the center regions of the cathode/wafer 16. This results in a higher deposition rate at the edge regions relative to the center regions of the cathode/wafer 16, forming excess metal 19 at the edges of the cathode/wafer 16. This, in turn, leads to overpolishing burden during subsequent CMP processing. Furthermore, non-uniform grain sizes between the wafer edges and center as a result of electroplating may degrade the EM or SM reliability.

One of the methods used to correct the non-uniform deposition of metal on a cathode/wafer has included the use of post-electroplating edge bead removal (EBR) processes. A common drawback of this method, however, is that EBR processes eliminate usable die areas on the wafer (about 2-5 mm for 8" wafers). Other methods have included enhancing CMP uniformity and controlling electroplating current distribution by sheltering (applied ECP). However, these methods have shown limited effectiveness.

Copper electropolishing (EP) has been regarded as a possible candidate for replacement of copper CMP in future super low-k (k<2) integration because the stress-free characteristics of copper EP are compatible with the poor mechanical properties of low-k materials. However, like electroplating techniques, copper electropolishing techniques result in the formation of metal layers having a non-uniform thickness caused by non-uniform current distribution in the electrochemical plating tank. As shown in FIG. 1A, when an anode/wafer 60 having a metal layer 60a is subjected to an electropolishing process in a conventional electroplating apparatus 10, the non-uniform current distribution in the plating tank 12 results in a cathode 65 having a layer of electroplated metal 66 with excess metal 67 at the edge regions. The metal layer 60a of the anode/wafer 60 has thin edge regions 20 relative to the remaining portion of the electroplated metal 66.

In an electroplating or electropolishing process, the magnitude of the electric field is inversely proportional to the distance between the cathode and anode. Therefore, the deposition current density can be compensated for by using a stepped or non-planar electrode to enhance the plating or polishing uniformity. Accordingly, a current-leveling electrode having a stepped or non-planar profile is needed to facilitate a uniform current distribution during an electroplating or electropolishing process in order to provide an electroplating layer having a uniform thickness on a substrate.

SUMMARY OF THE INVENTION

The present invention is generally directed to a novel current-leveling electroplating/electropolishing electrode which facilitates uniform current distribution during an ECP or electrochemical polishing process to deposit or electropolish a metal layer having a substantially uniform thickness on a substrate. The current-leveling electrode includes a base electrode and one or multiple sub-electrodes which, depending on the desired electroplating or electropolishing profile to be formed on a substrate, can be attached to the base electrode to impart a stepped, convex or non-planar configuration to the electrode. Accordingly, during an electroplating or electropolishing process, the stepped profile of the electrode establishes higher current densities between the electrode and the center portion of a substrate as compared to the current density between the electrode and the edge of the substrate. This results in electroplating or electropolishing of a metal layer having a substantially uniform thickness on the substrate, thereby improving the yield and reliability of devices fabricated on a wafer. Furthermore, the flexible structure of the current-leveling electrode facilitates improved process throughput by widening the process window for copper electroplating.

BRIEF DESCRIPTION OF THE DRAWINGS

The invention will now be described, by way of example, with reference to the accompanying drawings, in which.

DETAILED DESCRIPTION OF THE INVENTION

The present invention contemplates a novel current-leveling electroplating/electropolishing electrode which has a flexible geometry to facilitate uniform current distribution between an anode and a cathode in an electroplating or electropolishing process. The current-leveling electrode includes a base electrode and multiple sub-electrodes a selected number of which can be attached to the base electrode to impart a stepped, convex or non-planar configuration to the electrode, depending on the desired electroplating or electropolishing profile to be formed on a substrate. Accordingly, during an electroplating or electropolishing process, the stepped profile of the electrode establishes higher current densities between the electrode and the center portion of a substrate as compared to the current density between the electrode and the edge portion of the substrate. Consequently, in an electroplating process, a metal layer having a substantially uniform thickness is deposited on the substrate. In an electropolishing process, metal is removed from a metal layer on a wafer at substantially equal rates. This improves the yield and reliability of devices fabricated on the wafer. Furthermore, the flexible stepped or tapered geometry of the current-leveling electrode facilitates improved process throughput by widening the process window for copper electroplating.

Figure 1:
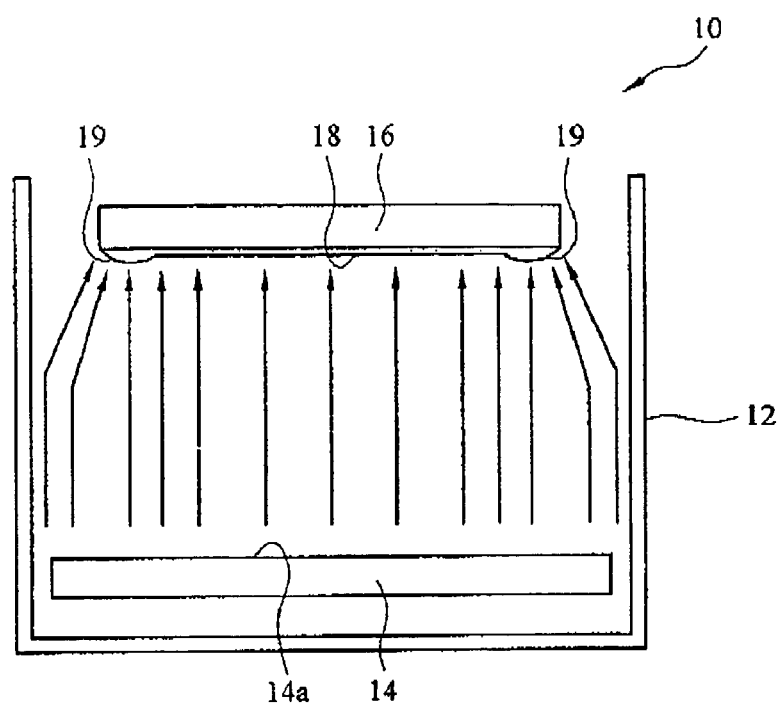
FIG. 1 is a schematic view of a conventional electrochemical plating (ECP) apparatus, illustrating non-uniform deposition of a metal layer on a wafer in an electroplating process.
Figure 1A:
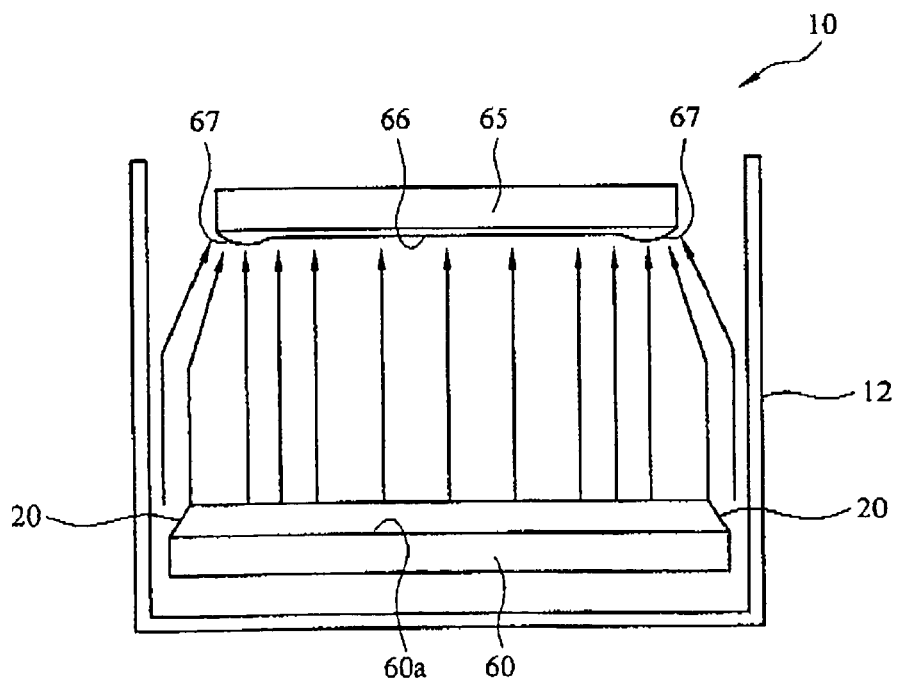
FIG. 1A is a schematic view of a conventional electrochemical plating (ECP) apparatus, illustrating non-uniform removal of metal from a metal layer on a wafer in an electropolishing process.
Figure 2:
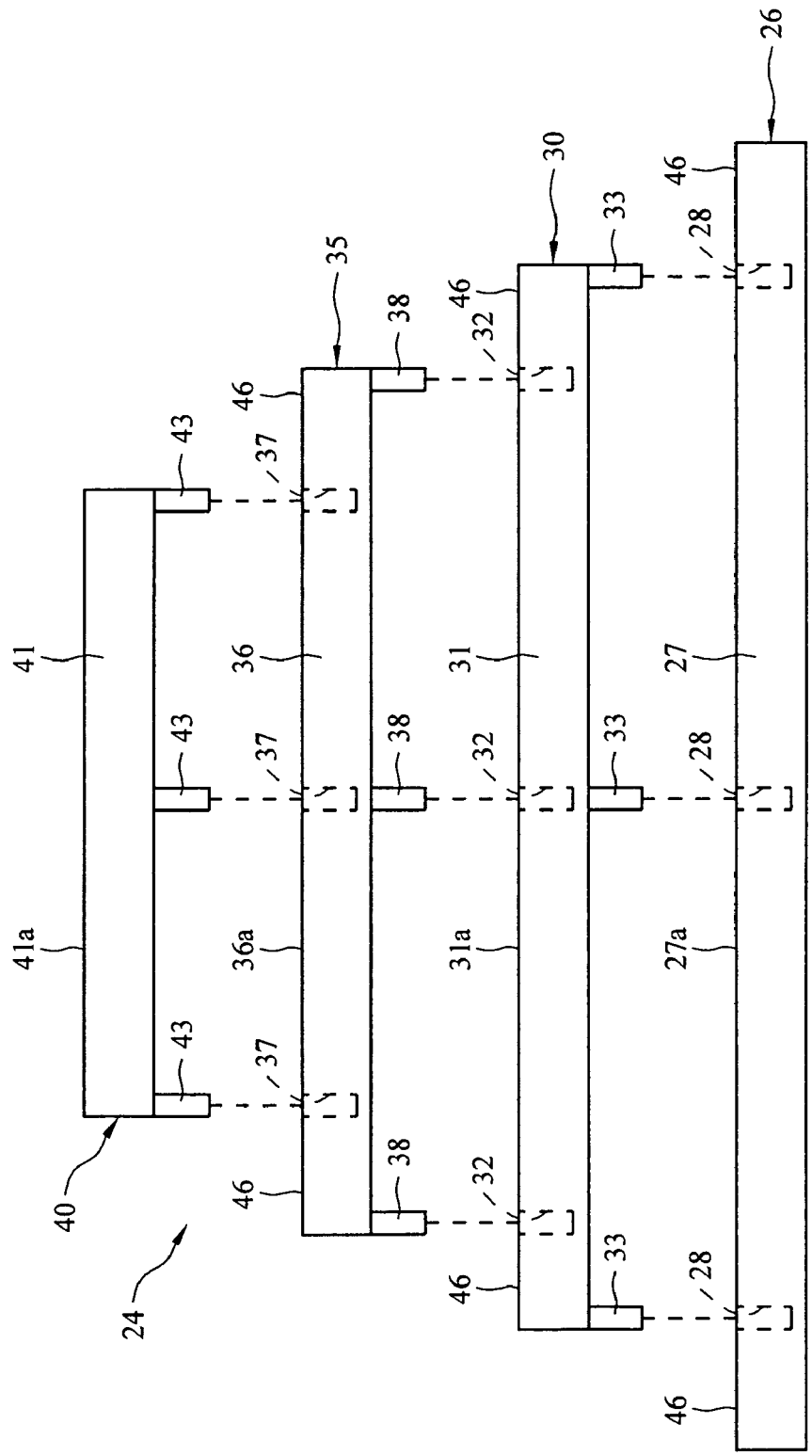
FIG. 2 is an exploded view of a current-leveling electrode according to the present invention.

Referring to FIG. 2, an illustrative embodiment of the current-leveling electrode of the present invention is generally indicated by reference numeral 24. The current-leveling electrode 24 includes a base electrode 26 and one or multiple sub-electrodes 30, 35 and 40, respectively, which can be individually or successively mounted on each other or the base electrode 26 to impart a non-planar, convex, stepped or tapered configuration to the current-leveling electrode 24. While three sub-electrodes 30, 35 and 40, respectively, are shown in FIG. 2, it is understood that the current-leveling electrode 24 may have four or more sub-electrodes depending on the use requirements of the current-leveling electrode 24. Furthermore, while they are described herein as having a generally disc-shaped configuration, the base electrode and sub-electrodes may have any desired shape or pattern which is consistent with the use requirements of the current-leveling electrode 24.

The base electrode 26 includes an electrode body 27 which may be a soluble metal such as copper (Cu), an insoluble metal such as platinum (Pt), or may include both soluble and insoluble metals. The electrode body 27 typically has a disc-shaped configuration and includes a planar surface 27a. Multiple peg openings 28, the purpose of which will be hereinafter described, extend into the planar surface 27a.

The sub-electrode 30 includes an electrode body 31 which may have a generally disc-shaped configuration and a width or diameter which is smaller than that of the electrode body 27 of the base electrode 26. The electrode body 31 may be a soluble metal such as Cu, an insoluble metal such as Pt, or may include both soluble and insoluble metals. Multiple mount pegs 33 extend downwardly from the electrode body 31 for alignment with and insertion in the respective peg openings 28 provided in the upper surface 27a of the electrode body 27 of the base electrode 26. Multiple peg openings 32 extend into the typically planar surface 31a of the electrode body 31.

The sub-electrode 35 is typically similar in construction to the sub-electrode 30. The sub-electrode 35 includes an electrode body 36 which is typically disc-shaped in configuration and has a width or diameter smaller than that of the electrode body 31 of the sub-electrode 30. The electrode body 36 typically has a generally planar surface 36a and may be a soluble metal such as Cu, an insoluble metal such as Pt, or both soluble and insoluble metals. Multiple mount pegs 38 extend downwardly from the electrode body 36 for alignment with and insertion in the respective peg openings 32 provided in the upper surface 31a of the electrode body 31 of the sub-electrode 30. Multiple peg openings 37 extend into the planar surface 36a of the electrode body 36.

The sub-electrode 40 is typically similar in construction to the sub-electrode 30 and the sub-electrode 35 and includes an electrode body 41 which is typically disc-shaped in configuration and has a width or diameter smaller than that of the electrode body 36 of the sub-electrode 35. The electrode body 41 typically has a generally planar surface 41a and may be a soluble metal such as Cu, an insoluble metal such as Pt, or both soluble and insoluble metals. Multiple mount pegs 43 extend downwardly from the electrode body 41 for alignment with and insertion in the respective peg openings 37 provided in the upper surface 36a of the electrode body 36 of the sub-electrode 35. Multiple peg openings (not shown) may extend into the planar surface 41a of the electrode body 41 to facilitate attachment of an additional sub-electrode (not shown) to the sub-electrode 40, depending on the use requirements of the current-leveling electrode 24.

Figure 3:
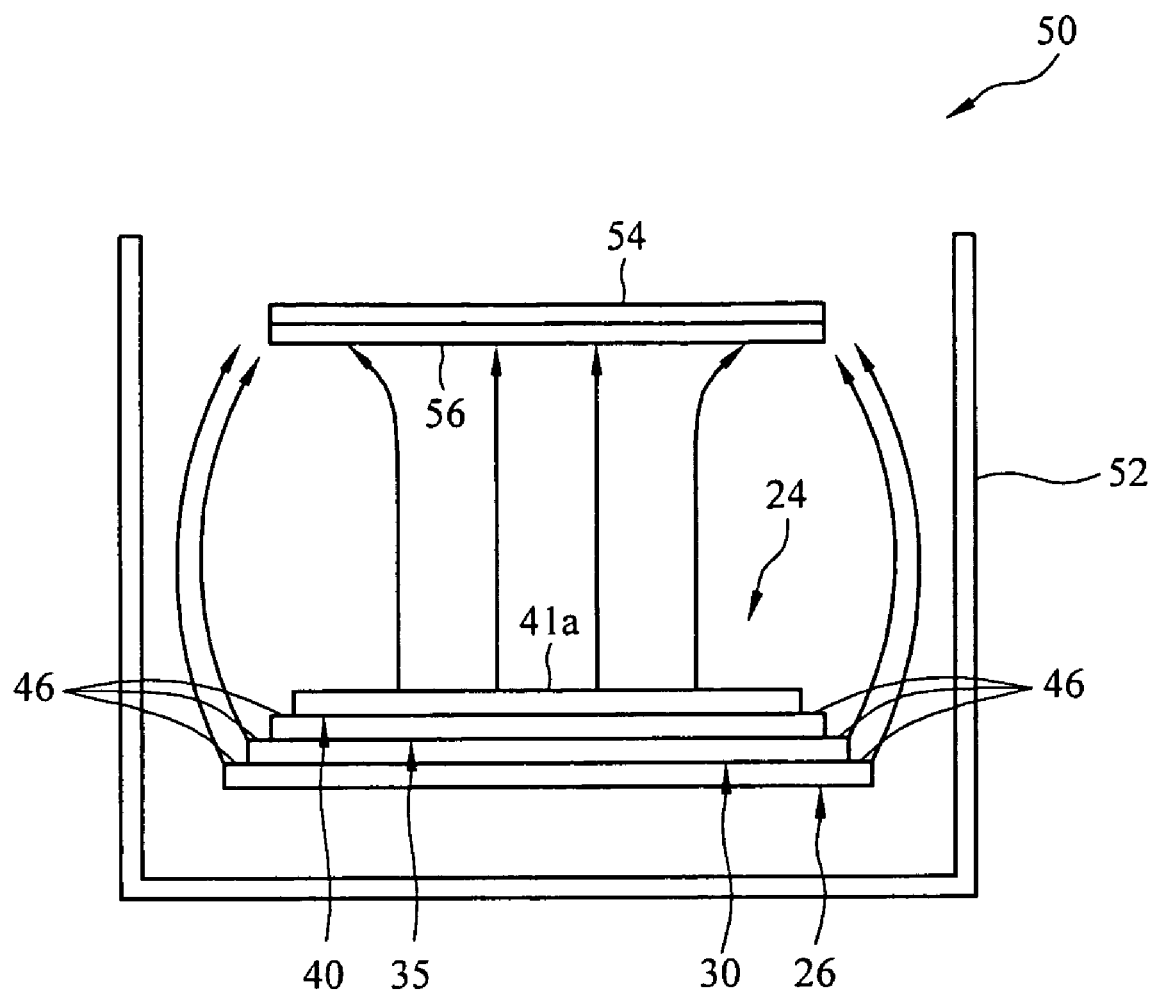
FIG. 3 is a schematic view of an electrochemical plating apparatus, illustrating deposition of a metal layer having uniform thickness on a wafer using the current-leveling electrode of FIG. 2.

Referring next to FIG. 3, the current-leveling electrode 24 can be used in an electroplating or electropolishing process using an electrochemical plating apparatus 50, which may be conventional. The apparatus 50 typically includes a tank 52 for containing an electrochemical plating electrolyte solution (not shown), such as copper sulfate, for example. Depending on the desired thickness profile of an electroplated metal 56 to be electroplated or electropolished on a wafer 54, the current-leveling electrode 24 can be assembled to include the base electrode 26 and the sub-electrode 30, either alone or in combination with the sub-electrode 35 or both the sub-electrode 35 and the sub-electrode 40, with or without additional sub-electrodes stacked on the sub-electrode 40. The greater the number of sub-electrodes which are mounted on the base electrode 26, the greater the degree of uniformity achieved in the electroplated or electropolished metal 56 on the wafer 54.

When the sub-electrodes 30, 35 and 40 are mounted on the base electrode 26 and each other in the assembled current-leveling electrode 24, the electrode 24 has a stepped, tapered or convex profile with exposed surface regions 46 on the base electrode 26, sub-electrode 30 and sub-electrode 35, respectively. The current-leveling electrode 24 and the wafer 54 are immersed in the electrochemical electrolyte solution (not shown) contained in the tank 52. In an electroplating process, as a current is applied, the current-leveling electrode 24 functions as an anode and the wafer 54 functions as a cathode. Accordingly, metal oxidized at the current-leveling electrode 24 travels as metal cations through the electrolyte solution to the wafer 54, where the metal cations are reduced and coat the wafer 54 as the electroplated metal 56.

The exposed surface regions 46 of the base electrode 26 and sub-electrodes 30 and 35, respectively, are increasingly proximate to the wafer 54. Consequently, the current density of the electric current applied between the current-leveling electrode 24 and wafer 54 increases from the edge to the center of the wafer 54. This counteracts the natural tendency for a larger quantity of metal to be electroplated onto the edge regions relative to the center region of the wafer 54. As a result, the thickness of the electroplated metal 56 is substantially uniform across the entire surface of the wafer 54.

In an electropolishing process, an electrical current of reverse polarity is applied such that the current-leveling electrode 24 is the cathode and the wafer 54 is the anode. Accordingly, the electroplated metal 56 is oxidized at the wafer 54 and metal cations are reduced at and electroplated onto the current-leveling electrode 24. The stepped configuration of the current-leveling electrode 24 facilitates establishment of an electrical current having a higher current density at the center portion relative to the edge portion of the wafer 54. Consequently, metal is removed from the electroplated metal 56 at substantially equal rates among all regions of the wafer 54.

While the preferred embodiments of the invention have been described above, it will be recognized and understood that various modifications can be made in the invention and the appended claims are intended to cover all such modifications which may fall within the spirit and scope of the invention.

What is claimed is:

1. A semiconductor wafer electroplating and electropolishing apparatus current-leveling electrode comprising:
    a solid disc-shaped base electrode; and
    at least one solid disc-shaped sub-electrode stacked on a major surface of said base electrode, said at least one sub-electrode having a width less than a width of said base electrode, said current-leveling electrode having a generally circular stepped convex configuration.

2. The current-leveling electrode of claim 1 wherein said base electrode and said at least one sub-electrode comprises a soluble metal.

3. The current-leveling electrode of claim 2 wherein said soluble metal comprises Cu.

4. The current-leveling electrode of claim 1 wherein said base electrode and said at least one sub-electrode comprises an insoluble metal.

5. The current-leveling electrode of claim 4 wherein said insoluble metal comprises Pt.

6. The current-leveling electrode of claim 1 wherein said at least one sub-electrode comprises a plurality of sub-electrodes.

7. The current-leveling electrode of claim 6 wherein said plurality of sub-electrodes comprises a first sub-electrode stacked on a major surface of said base electrode, a second sub-electrode stacked on a major surface of said first sub-electrode and a third sub-electrode stacked on a major surface of said second sub-electrode.

8. The current-leveling electrode of claim 7 wherein said first sub-electrode has a width smaller than said width of said base electrode, said second sub-electrode has a width smaller than said width of said first sub-electrode and said third sub-electrode has a width smaller than said width of said second electrode.

9. A semiconductor wafer electroplating and electropolishing apparatus current-leveling electrode comprising:
    a solid disc-shaped base electrode comprising a base electrode body having a set of peg openings on a major surface;
    a solid disc-shaped sub-electrode comprising a sub-electrode body having a width less than a width of said base electrode body of said base electrode; and a set of mount pegs carried by said sub-electrode body of said sub-electrode for insertion in said set of peg openings, respectively, of said base electrode body of said base electrode, wherein said sub-electrode is stacked on said major surface of said base electrode, said current-leveling electrode having a generally circular stepped convex configuration.

10. The current-leveling electrode of claim 9 wherein said base electrode body of said base electrode and said sub-electrode body of said sub-electrode comprises a soluble metal.

11. The current-leveling electrode of claim 10 wherein said soluble metal comprises Cu.

12. The current-leveling electrode of claim 9 wherein said base electrode body of said base electrode and said sub-electrode body of said sub-electrode comprises an insoluble metal.

13. The current-leveling electrode of claim 12 wherein said insoluble metal comprises Pt.

14. The current-leveling electrode of claim 9 further comprising a second sub-electrode having a second sub-electrode body stacked on a major surface of said first sub-electrode and a third sub-electrode having a third sub-electrode body stacked on a major surface of said second sub-electrode.

15. The current-leveling electrode of claim 14 further comprising a second set of peg openings provided in said sub-electrode body of said sub-electrode, a second set of mount pegs carried by said second sub-electrode body of said second sub-electrode for insertion in said second set of peg openings, a third set of peg openings provided in said second sub-electrode body of said second sub-electrode, and a third set of mount pegs carried by said third sub-electrode body of said third sub-electrode for insertion in said third set of peg openings.

16. The current-leveling electrode of claim 15 wherein said first sub-electrode body has a width smaller than said width of said base electrode body, said second sub-electrode body has a width smaller than said width of said first sub-electrode body and said third sub-electrode body has a width smaller than said width of said second sub-electrode body.

17. A semiconductor wafer electroplating and electropolishing apparatus current-leveling electrode comprising:
a solid disc-shaped base electrode;
a plurality of solid disc-shaped sub-electrodes sequentially attached to a major surface of a respective underlying sub-electrode, one of said sub-electrodes stacked on a major surface of said base electrode, said plurality of sub-electrodes stacked relationship to each other; and
wherein said base electrode and said plurality of sub-electrodes impart a generally circular stepped convex configuration to said current-leveling electrode.

18. The current-leveling electrode of claim 17 wherein said base electrode and said plurality of sub-electrodes each comprises a soluble metal.

19. The current-leveling electrode of claim 17 wherein said base electrode and said plurality of sub-electrodes each comprises an insoluble metal.

20. The current-leveling electrode of claim 17 further comprising a plurality of pegs carried by each of said plurality of sub-electrodes for securing said plurality of sub-electrodes and said base electrode in said current-leveling electrode.

21. A semiconductor wafer electroplating and electropolishing apparatus comprising:
a tank for containing a wafer; and
a current-leveling electrode provided in said tank for carrying out an electroplating and electropolishing process on said wafer, said current-leveling electrode comprising a solid disc-shaped base electrode and at least one solid disc-shaped sub-electrode having a width less than a width of said base electrode, said at least one sub-electrode stacked on a major surface of said base electrode, said current-leveling electrode having a generally circular stepped convex configuration.

22. The electroplating apparatus of claim 21 wherein said base electrode and said at least one sub-electrode comprises a soluble metal.

23. The electroplating apparatus of claim 22 wherein said soluble metal comprises Cu.

24. The electroplating apparatus of claim 21 wherein said base electrode and said at least one sub-electrode comprises an insoluble metal.

25. The electroplating apparatus of claim 24 wherein said insoluble metal comprises Pt.

26. The electroplating apparatus of claim 21 wherein said at least one sub-electrode comprises a plurality of sub-electrodes.

27. The electroplating apparatus of claim 26 wherein said plurality of sub-electrodes comprises a first sub-electrode carried by said base electrode, a second sub-electrode carried by said first sub-electrode and a third sub-electrode carried by said second sub-electrode.

28. The electroplating apparatus of claim 27 wherein said first sub-electrode has a width smaller than said width of said base electrode, said second sub-electrode has a width smaller than said width of said first sub-electrode and said third sub-electrode has a width smaller than said width of said second electrode.

* * * * *